(12) United States Patent
Clendenning et al.

(10) Patent No.: US 10,896,852 B2
(45) Date of Patent: Jan. 19, 2021

(54) METHODS FOR DOPING A SUB-FIN REGION OF A SEMICONDUCTOR FIN STRUCTURE AND DEVICES CONTAINING THE SAME

(71) Applicant: Intel Corporation, Santa Clara, CA (US)

(72) Inventors: Scott B. Clendenning, Portland, OR (US); Martin Mitan, Hillsboro, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 386 days.

(21) Appl. No.: 15/752,189

(22) PCT Filed: Sep. 17, 2015

(86) PCT No.: PCT/US2015/050711
§ 371 (c)(1),
(2) Date: Feb. 12, 2018

(87) PCT Pub. No.: WO2017/048259
PCT Pub. Date: Mar. 23, 2017

(65) Prior Publication Data
US 2020/0211901 A1 Jul. 2, 2020

(51) Int. Cl.
*H01L 21/8234* (2006.01)
*H01L 27/06* (2006.01)
(Continued)

(52) U.S. Cl.
CPC ........... *H01L 21/823431* (2013.01); *H01L 21/823412* (2013.01); *H01L 27/0688* (2013.01);
(Continued)

(58) Field of Classification Search
None
See application file for complete search history.

(56) References Cited

U.S. PATENT DOCUMENTS 8,748,247 B2   6/2014  Fumitake
9,530,698 B1 * 12/2016  Basker ............ H01L 21/823821
(Continued)

FOREIGN PATENT DOCUMENTS

CN   103855015 A * 6/2014  ......... H01L 29/0638
JP   2008-053725 A   3/2008

OTHER PUBLICATIONS

CN103855015A English translation, 2014, pp. 1-8 (Year: 2014).*
(Continued)

*Primary Examiner* — Shaun M Campbell
(74) *Attorney, Agent, or Firm* — Schwabe, Williamson & Wyatt, P.C.

(57) ABSTRACT

Methods for doping a subfin region of a semiconductor fin structure include forming a fin on a substrate; forming an oxide material on the substrate and a portion of the fin that corresponds to a sub-fin region of the fin; forming a hard mask on a top-fin region of the fin that is disposed above the sub-fin region; exposing a surface of the sub-fin region by removing the oxide material from a surface of the sub-fin region and leaving a layer of the oxide material on the substrate; depositing a dopant material on the hard mask, the surface of the subfin region, and the layer of the oxide material on the substrate; and removing the hard mask from the top-fin region to expose a surface of the top-fin region. Devices constructed using the disclosed methods are also provided, and other embodiments are discussed.

25 Claims, 13 Drawing Sheets

(51) Int. Cl.
*H01L 27/088* (2006.01)
*H01L 29/417* (2006.01)
*H01L 29/66* (2006.01)
*H01L 29/78* (2006.01)

(52) U.S. Cl.
CPC .... *H01L 27/0886* (2013.01); *H01L 29/41791* (2013.01); *H01L 29/66795* (2013.01); *H01L 29/785* (2013.01)

(56) References Cited

U.S. PATENT DOCUMENTS

| | | |
|---|---|---|
| 2008/0017314 A1 | 1/2008 | Huang et al. |
| 2008/0185691 A1 | 8/2008 | Cheng et al. |
| 2010/0176424 A1 | 7/2010 | Yeo et al. |
| 2011/0269287 A1 | 11/2011 | Tsai et al. |
| 2013/0102137 A1 | 4/2013 | Jeng |
| 2013/0313619 A1* | 11/2013 | Fumitake ............ H01L 27/0924 257/288 |
| 2015/0035046 A1* | 2/2015 | Kim .................... H01L 27/0886 257/327 |
| 2015/0101662 A1* | 4/2015 | Seutter ............. H01L 31/02167 136/256 |
| 2016/0049487 A1* | 2/2016 | Xu .................... H01L 29/41791 257/288 |
| 2016/0379828 A1* | 12/2016 | Mane ..................... C23C 16/56 257/607 |
| 2017/0062204 A1* | 3/2017 | Suzuki ............. C23C 16/45553 |

OTHER PUBLICATIONS

International Search Report and Written Opinion dated May 30, 2016 for International Application No. PCT/US2015/050711, 9 pages.

* cited by examiner

METHODS FOR DOPING A SUB-FIN REGION OF A SEMICONDUCTOR FIN STRUCTURE AND DEVICES CONTAINING THE SAME

CROSS REFERENCE TO RELATED APPLICATIONS

The present application is a national phase entry under 35 U.S.C. § 371 of International Application No. PCT/US2015/050711, filed Sep. 17, 2015, entitled "METHODS FOR DOPING A SUB-FIN REGION OF A SEMICONDUCTOR FIN STRUCTURE AND DEVICES CONTAINING THE SAME", which designated, among the various States, the United States of America. The disclosure of International Application No. PCT/US2015/050711 is hereby incorporated by reference in its entirety.

TECHNICAL FIELD

Example embodiments generally relate to the field of semiconductors and more particularly relate to selectively doping a sub-fin region of a semiconductor fin, as well as device structures, devices, and systems formed using such techniques.

BACKGROUND

Three-dimensional (3D) semiconductor devices typically include a thin 3D silicon fin that rises up vertically from a silicon substrate. When the 3D semiconductor device is a tri-gate transistor, the fins usually act as an active channel region of the tri-gate transistor. Such transistors are often referred to as "tri-gate transistors" as the channel is controlled by a gate on three sides. For many applications, it may be desired for a bottom portion of the fins (also referred to as a "sub-fin region") to be doped with one or more dopant materials while a top portion of the fins (also referred to as a "top-fin region" and/or an "active fin region") remains undoped. However, current semiconductor fabrication methods do not provide techniques for doping the sub-fin region without introducing competing carriers into the top-fin region and/or without damaging the fins of the 3D semiconductor fin structure.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
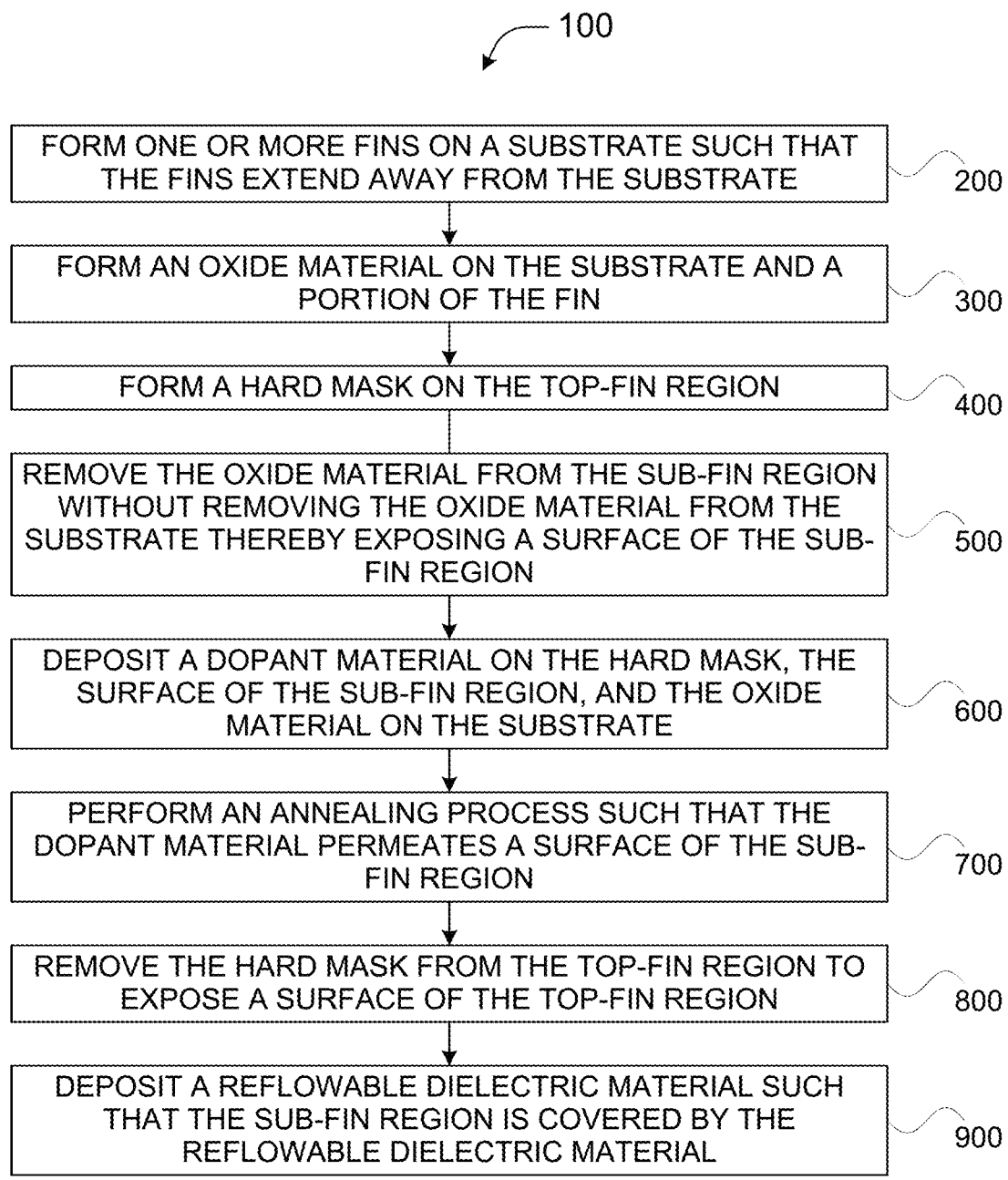
FIG. 1 shows a flow diagram illustrating an example process for selectively doping a sub-fin region of a semiconductor fin structure, in accordance with various example embodiments.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods, device structures, devices, apparatuses, and computing platforms, are described below related to selective and/or conformal doping of a sub-fin region of a semiconductor fin structure, which may be used for the fabrication of a semiconductor device, such as tri-gate transistors, high aspect ratio devices such as nanowire, and/or other like three-dimensional (3D) semiconductor devices. The example embodiments improve performance of semiconductor devices by providing active isolation of the sub-fin region of one or more semiconductor fins without introducing competing carriers into an active fin region of the semiconductor fins. Moreover, the example embodiments allow for more abrupt dopant profiles and may reduce overall damage to the semiconductor fins by reducing and/or eliminating the use of traditional implantation processes.

The example embodiments provide a method for selective nitridization of an upper region or top-region of one or more semiconductor fins to form a conformal silicon nitride "top cap" or hard mask layer. The hard mask layer may be used to enable uniform solid-source doping of the sub-fin region of the semiconductor fins with various dopant profiles, including dopant profiles having relatively high concentration of dopants and/or dopant profiles having relatively high gradient changes for dopants. The dopant material may include any suitable material, such as boron, phosphorus, arsenic, antimony, indium, or a combination of two or more of boron, phosphorus, arsenic, antimony, and indium. The example embodiments also provide that a conformal deposition process may be performed, where the conformal deposition process includes at least one of implant plasma dopant deposition, atomic layer deposition, molecular layer deposition, or chemical vapor deposition. A drive-in anneal process for the dopant material may also be utilized, after the conformal deposition process and prior to removal of the hard mask layer, in order to allow the dopant material to permeate a surface of the sub-fin region. The sub-fin region may include the dopant material, and in some embodiments, the sub-fin region may also include traces of nitrogen, ammonia, and/or other remnants of the conformal deposition process. The example embodiments provide that the silicon nitride hard mask layer may be removed after the dopant material is deposited on and penetrates the sub-fin region. The example embodiments also provide that a dielectric material, such as a reflowable dielectric material, which may be a spin-on glass (SOG) material, may be formed over the doped sub-fin region in order to create a desired electrically isolated semiconductor fin structure with a doped sub-fin region.

The example embodiments provide a semiconductor device including a semiconductor fin structure, which may include a plurality of fins, one or more of which include a sub-fin region and a top-fin region. The fins may be disposed on a substrate and may be laterally separated from one another, and individual fins may extend away from the substrate. The sub-fin region of the individual fins may be doped with a dopant material and the top-fin region of the individual fins may be undoped. The semiconductor device may also include reflowable dielectric material, which may be a SOG material, covering the doped sub-fin region and the substrate. The semiconductor fin structure may be fabricated according to the example embodiments disclosed herein. Additionally, as discussed previously, the example embodiments provide that the fins may be fabricated by forming a silicon nitride hard mask layer on the top-fin region, which may be removed after the dopant material is deposited on the sub-fin region. The removal of the hard mask region may also include the removal of a layer of silicon from the top-fin region, which may result in the doped sub-fin region having a greater width than the undoped top-fin region. The fins may have a scalloped shape or otherwise rounded edges due to the difference in sizes, shapes, and/or surface areas of the sub-fin region and the top-fin region.

The techniques discussed herein may provide a simplified fabrication process for forming semiconductor fins with selectively doped sub-fin regions. Such selectively doped sub-fin regions may eliminate fabrication steps that would otherwise cause complication, variability in processing, and/or damage to the semiconductor fin (e.g., channel regions and/or source/drain regions of the fin). Solid thin film dopant layers may allow for the creation of relatively shallow and/or abrupt dopant profiles that are not possible with conventional implant and/or flowable dopants containing oxides. Furthermore, devices formed using such techniques may provide enhanced performance and reduced cost of manufacture.

FIG. 1 shows a flow diagram illustrating an example process 100 for selectively doping a sub-fin region of a semiconductor fin structure, in accordance with various example embodiments. Process 100 may be implemented to fabricate a semiconductor fin structure as shown by FIGS. 2-10, or any other transistor structures as discussed herein. In the illustrated implementation, process 100 may include one or more operations as illustrated by operations 200-800. While particular examples and orders of operations are illustrated in FIGS. 1-10, in various embodiments, these operations may be re-ordered, broken into additional operations, combined, and/or omitted altogether without departing from the example embodiments disclosed herein. Furthermore, it should be noted that, because the semiconductor fin structure shown by FIGS. 2-10 is a 3D structure, the surfaces of the semiconductor fin structure may extend horizontally out of the plane shown by FIGS. 2-10 (e.g., into the page and/or out of the page). Moreover, the example embodiments shown and described with regard to FIGS. 2-10 may also apply to the surfaces of the semiconductor fin structure that extend horizontally out of the plane shown by FIGS. 2-10.

Figure 2:
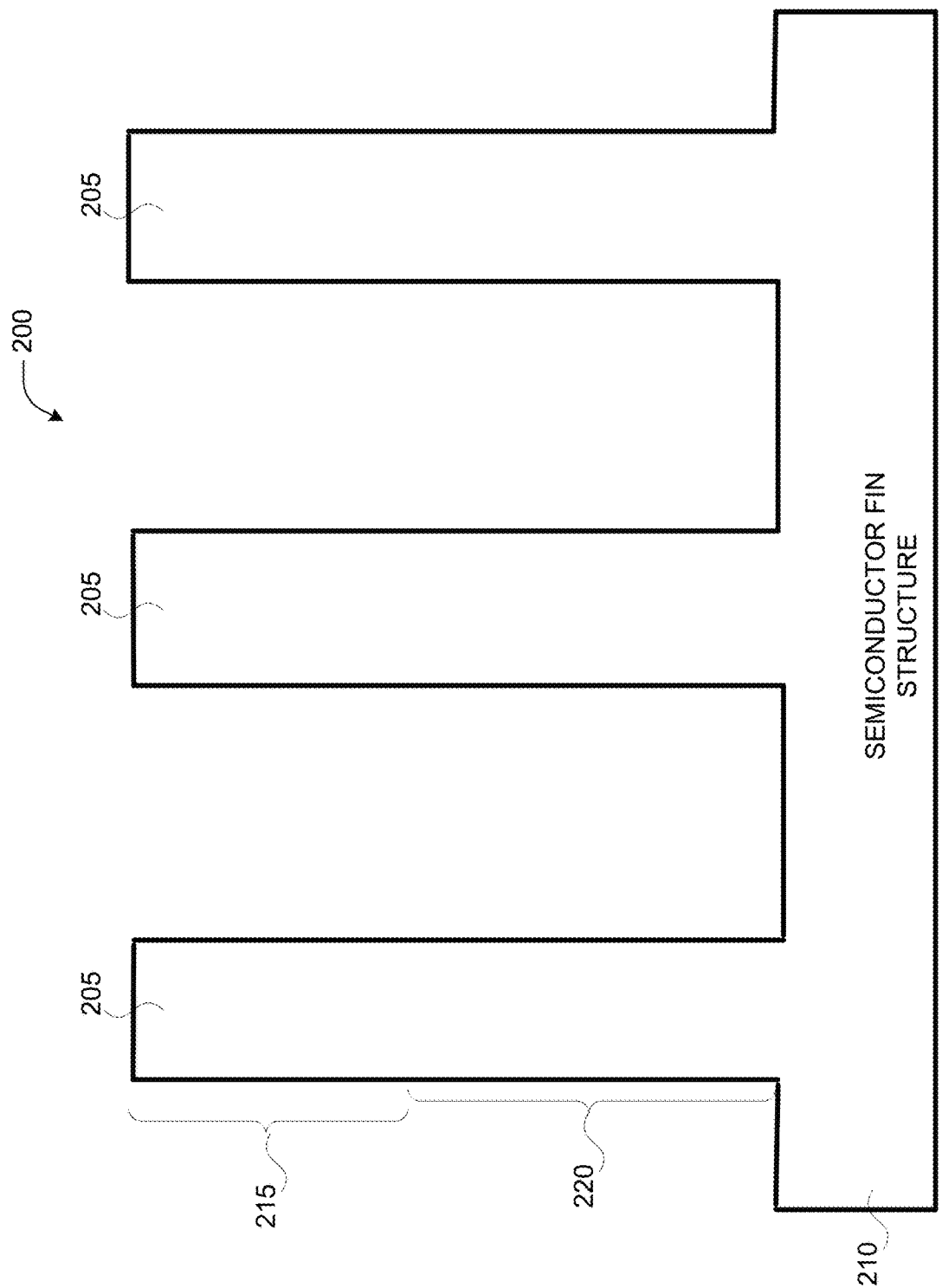
FIGS. 2-9 show cross-sectional views of an example semiconductor fin structure as particular fabrication operations are performed according to the process shown by FIG. 1, in accordance with various example embodiments.

Referring to FIGS. 1 and 2, process 100 may begin at operation 200, where one or more fins 205 are formed on a substrate 210 such that the one or more fins 205 extend away from the substrate 210. The semiconductor fin structure may include fins 205 patterned from substrate 210. In various embodiments, the fins 205 and substrate 210 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. The fins 205 may be formed using any suitable technique or techniques such as using a patterning and etch process of substrate 210 and/or the like. In some examples, fins 205 may be used for tri-gate transistor devices. In other examples, fins 205 may be an undercut fin to be used for nanowire devices. The fins 205 may include a top-fin region 215 and a sub-fin region 220. Lengths of the top-fin region 215 and the sub-fin region 220 may be application specific and may be chosen based on one or more design choices.

Figure 3:
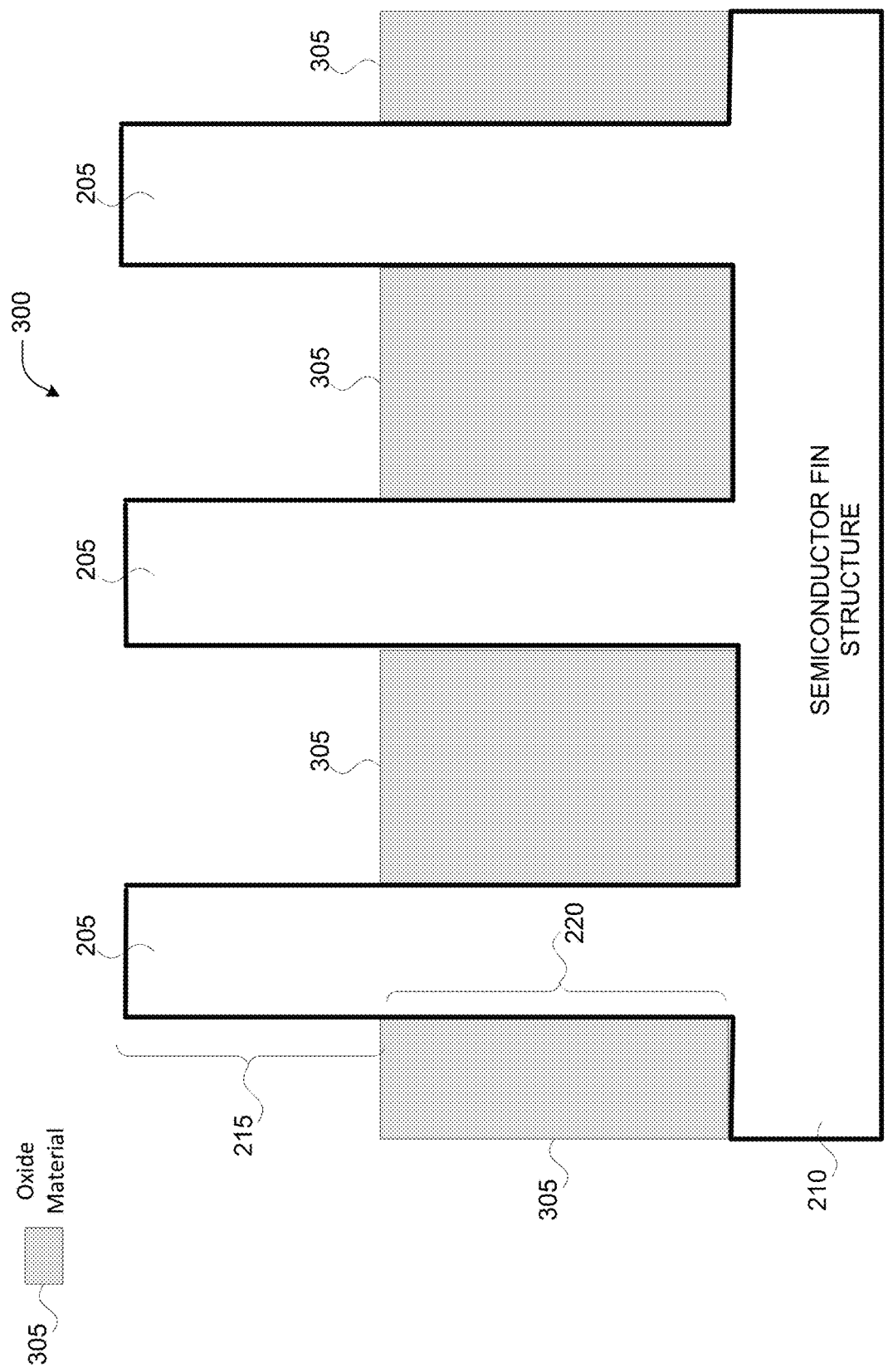

Referring to FIGS. 1 and 3, process 100 may proceed to operation 300, to form an oxide material 305 on the substrate 210 and the sub-fin region 220 of the fin 205. In some embodiments, the substrate 210 and/or the sub-fin region 220 of the fin 205 may be covered by the oxide material 305 and the top-fin region 215 of the fin 205 may not covered by the oxide material 305. The oxide material 305 may be made of silicon oxide (SiO), silicon dioxide ($SiO_2$), and/or any other suitable oxide material. The oxide material 305 may be formed using any known technique for forming oxide material on a semiconductor structure. For example, in various embodiments, the oxide material 305 may be formed by performing a spin-on procedure or a spin coating operation where the semiconductor fin structure is placed on a spinning apparatus (also referred to as a "spinner"), and a desired amount of the oxide material 305 is dropped on the semiconductor fin structure while it is spinning. The oxide material 305 being dropped on the semiconductor fin structure may allow the oxide material 305 to flow down into a space or region between the fins 205. The semiconductor fin structure may be spun on the spinner at any suitable speed or suitable cycles per minute. A thickness or size of the oxide material 305 may be controlled by controlling a viscosity of the oxide material 305 and/or by performing the spin-on operation for a desired period of time. In some embodiments, once the oxide material 305 is spun-on the semiconductor fin structure, an annealing process may be performed to cure the oxide material 305, and an etch process may be performed to reveal or expose the top-fin region 215. The etch process may be any suitable etching process described herein. A desired height or length of the top-fin region 215 to be exposed may be application specific and chosen based on one or more design choices. In other embodiments, the oxide material 305 may be formed by performing a suitable geometrically selective deposition process, wherein the oxide material 305 is grown from the surface of the substrate 210 towards the top-fin region 215 without covering the surface of the top-fin region 215.

Figure 4:
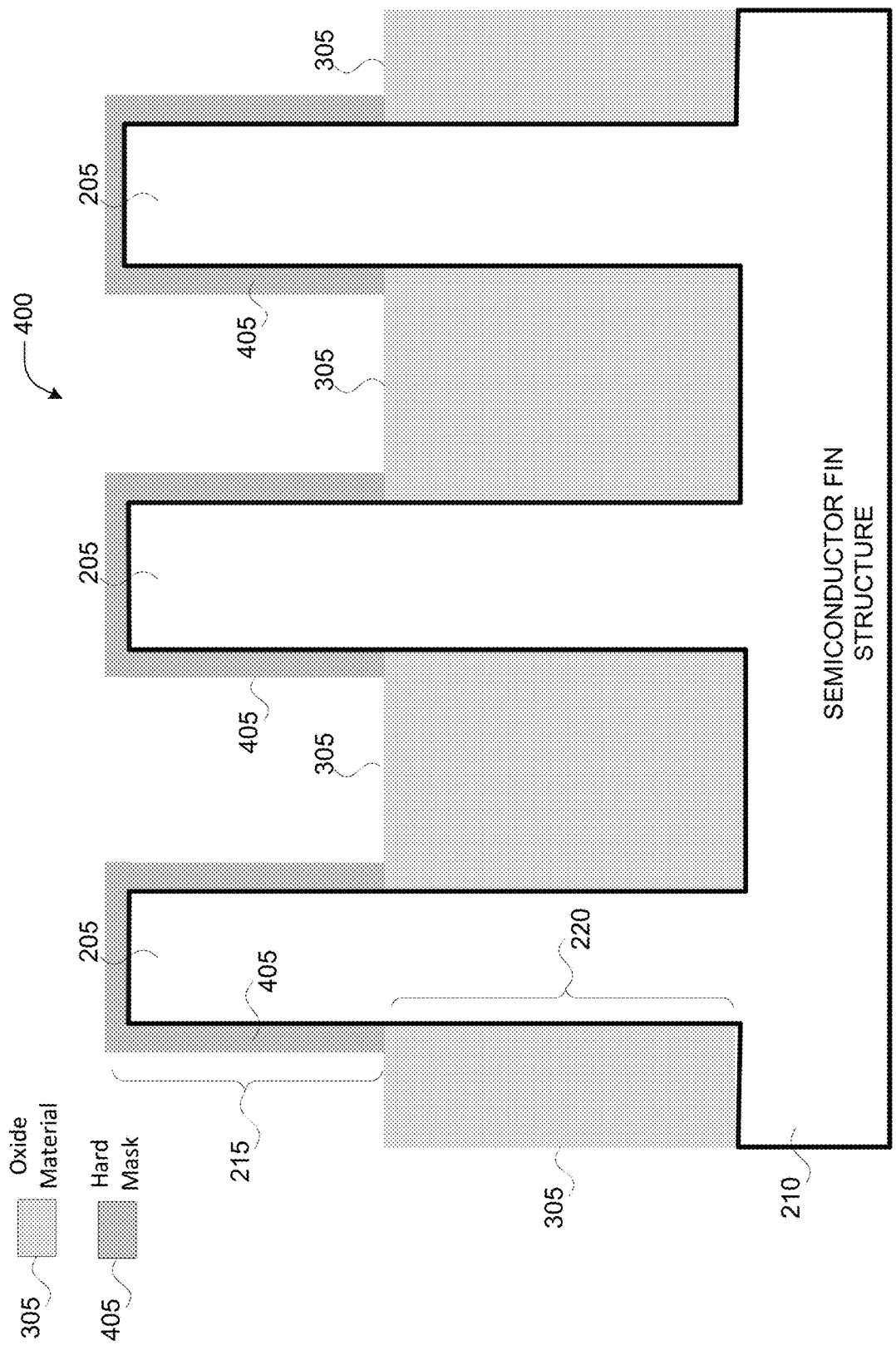

Referring to FIGS. 1 and 4, process 100 may proceed to operation 400, to form a hard mask 405 on the top-fin region 215. The hard mask 405 may be formed using any suitable technique or techniques. In some examples, hard mask 405 may be formed via a deposition operation using a vapor phase method, such as plasma exposure, atomic layer deposition (ALD), molecular layer deposition (MLD), or chemical vapor deposition (CVD). The temperature of such a deposition operation may be any suitable temperature such as a temperature in the range of room temperature (for example, approximately 21 degrees Celsius (° C.)) to 1100° C. In various embodiments, the semiconductor fin structure may be exposed to a remote nitrogen gas ($N_2$) or ammonia ($NH_3$) plasma to form a layer of silicon nitride on the top-fin region 215. In some embodiments, the semiconductor fin structure may be exposed to the remote nitrogen gas or ammonia plasma with an optional other reactant such as hydrogen ($H_2$) and/or an optional diluting inert gas such as helium (He) or Argon (Ar). In some embodiments, the semiconductor fin structure may be exposed to the remote nitrogen gas or ammonia plasma at a temperature in the range of 400° C. to 1100° C. for a time in the range of 1 to 600 seconds to form the layer of silicon nitride on top-fin region 215. In some embodiments, the semiconductor fin structure may be exposed to a hydrazine with or without one of the aforementioned optional other reactants. The silicon nitride may be any suitable silicon nitride material represented by $Si_xN_y$. In some embodiments, x and y may be integers. A thickness of the hard mask 405 may be based on the amount of time that the deposition operation is performed. In various embodiments, the hard mask 405 may be formed to have a thickness of 1 nanometer (nm) to 5 nm.

Figure 5:
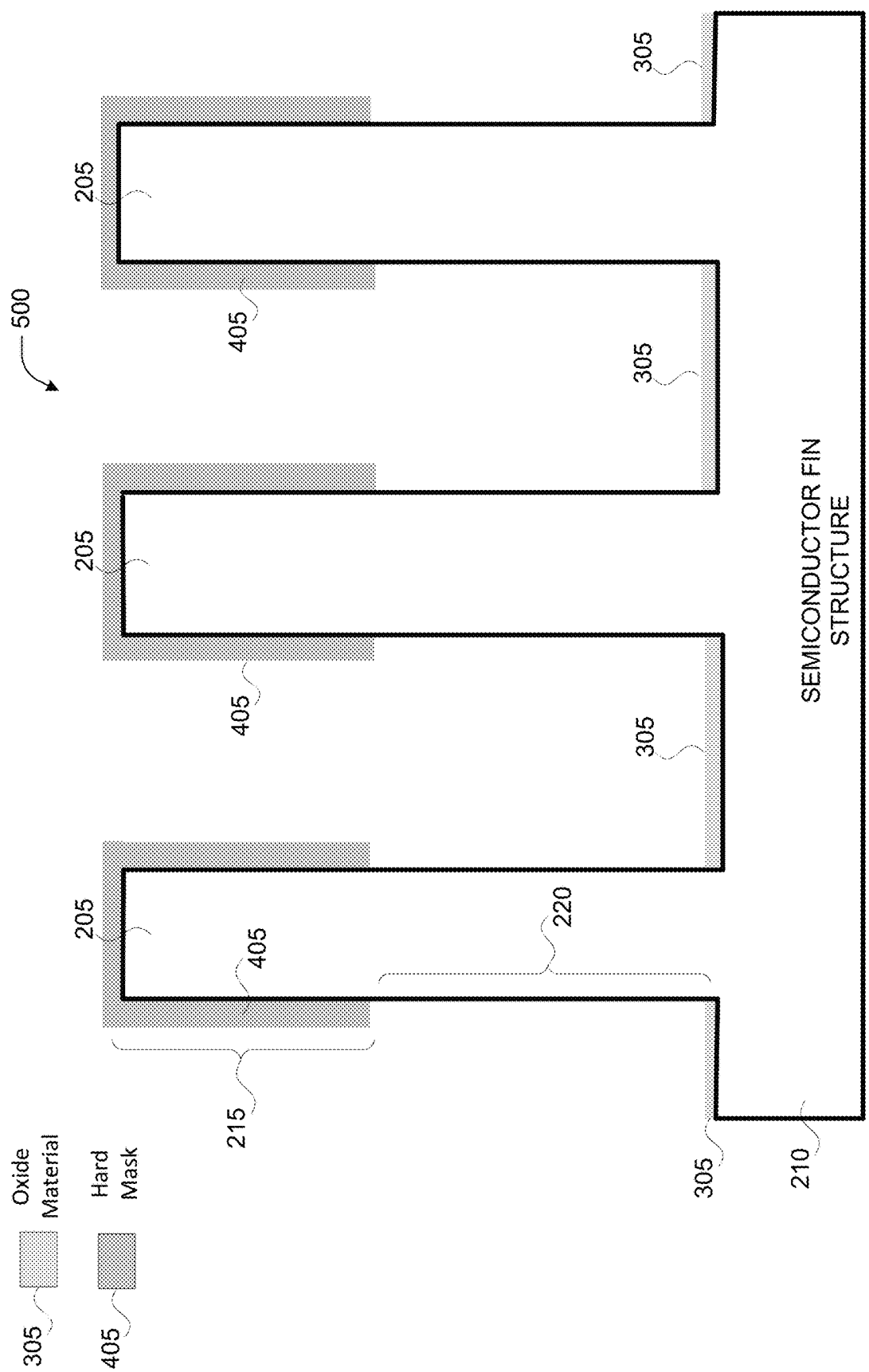

Referring to FIGS. 1 and 5, process 100 may proceed to operation 500, to expose a surface of the sub-fin region 220 by removing the oxide material 305 from a majority or all of the sub-fin region 220, while substantially leaving a layer of the oxide material 305 coupled to the substrate 210. The oxide material 305 may be removed according to any suitable oxide recess operation, such as a wet chemical etching process or a dry etching process. The wet chemical etching process may include a hydrofluoric-acid bath and the like. In various embodiments, the oxide recess operation may be performed until a layer of the oxide material 305 of a desired thickness remains on the substrate 210. The remaining layer of the oxide material 305 may protect the substrate 210 from the introduction of dopant material during the dopant deposition process discussed with regard to operation 600 and FIG. 6. Additionally, as shown by FIG. 5, the hard mask 405 may also remain on the top-fin region 215 after the oxide recess operation.

Figure 6:
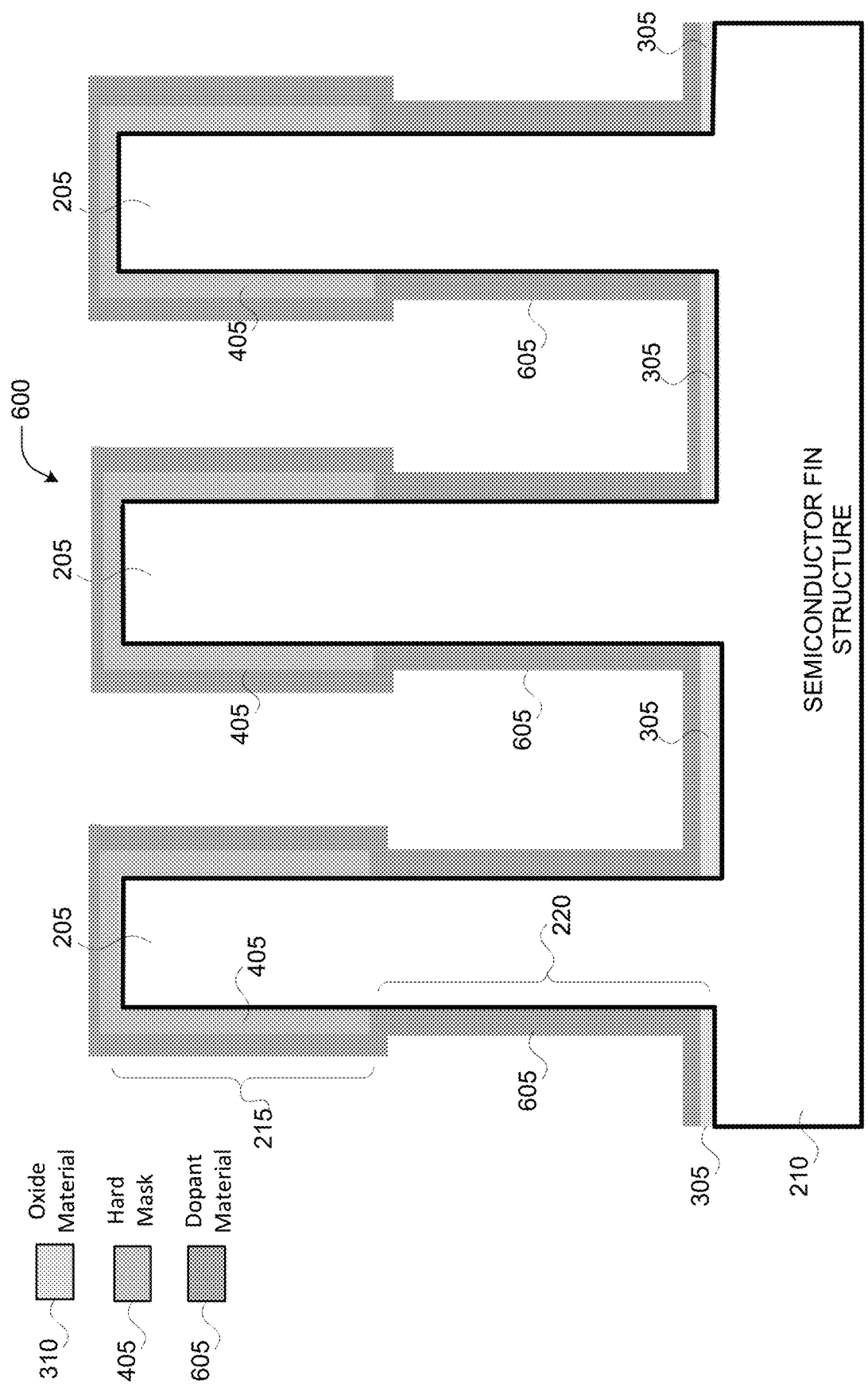

Referring to FIGS. 1 and 6, process 100 may proceed to operation 600, to deposit a dopant material 605 on the hard mask 405, a surface of the sub-fin region 220, and the oxide material 305 that is disposed on the substrate 210. The dopant material 605 may comprise any suitable material, such as boron (B), phosphorus (P), arsenic (As), antimony (Sb), indium (In), or a combination of two or more of B, P, As, Sb, and In. A thickness of the dopant material 605 deposited on the semiconductor fin structure may be in the rage of about 0.1 nm to 5 nm.

The dopant material 605 may be deposited according to any suitable doping operation, such as a conformal deposition process. In various embodiments, the conformal deposition process may include implant plasma dopant deposition, ALD, MLD, or CVD. The conformal deposition process by ALD may include using a main group halide and a homoelement precursor coreactant as. The halide may include Fluorine (F), Chlorine (Cl), Bromine (Br), or Iodine (I), and the homoelement precursor may include a homoleptic silyl or a homoleptic germyl compound. In various embodiments, the conformal deposition process by ALD may include ALD of B, P, As, or Sb including depositing at least one of a main group halide as a precursor and 1,4-dihydro-1,4-bis(trimethylsilyl) pyrazine as a reducing agent. In some embodiments, ALD of boron (B) may include depositing at least one of Boron trichloride ($BCl_3$) or tris(trimethylsilyl)boron ($B(SiMe_3)_3$); ALD of phosphorus (P) may include depositing at least one of Phosphorus trichloride ($PCl_3$) or tris(trimethylsilyl)phosphine ($P(SiMe_3)_3$); ALD of arsenic (As) may include depositing at least one of Arsenic trichloride ($AsCl_3$) or tris(trimethylsilyl)arsine (As $(SiMe_3)_3$); and ALD of antimony (Sb) including depositing at least one of Antimony trichloride ($SbCl_3$) and tris(trimethylsilyl)antimony ($Sb(SiMe_3)_3$).

In various embodiments, the conformal deposition process by MLD may include exposing the semiconductor fin structure to a precursor comprising allylboronic acid pinacol ester, triallylphosphine, or triallylarsine. The deposition by MLD may, in some embodiments, include depositing one or more dopant capping layers on the dopant material 605 on the sub-fin region 220, while in other embodiments, a dopant capping layer may not be used. In embodiments where one or more capping layers are deposited, the capping layers may be deposited according to any suitable process for depositing such layers. For example, a capping layer may be deposited on top of a dopant layer or stack of dopant layers of the dopant material 605 (not shown). In some embodiments, the capping layer may comprise one or more oxides, such as SiO and $SiO_2$, or one or more silicon nitrides, such as $Si_xN_y$, where x and y are integers, formed from a dielectric precursor deposited and reacted in a conformal film deposition (CFD) process. In various embodiments, an annealing operation, such as a drive-in annealing operation, may be performed to diffuse the dopant material 605 into the sub-fin region 220, which is discussed with regard to operation 700 and FIG. 7. In embodiments where one or more capping layers are utilized, the dopant material 405 may be capped prior to the annealing process. Additionally, the one or more dopant capping layers may be removed when removing any excess dopant material 605 remaining on the surface of the sub-fin region 215 and/or the hard mask 405.

Figure 7:
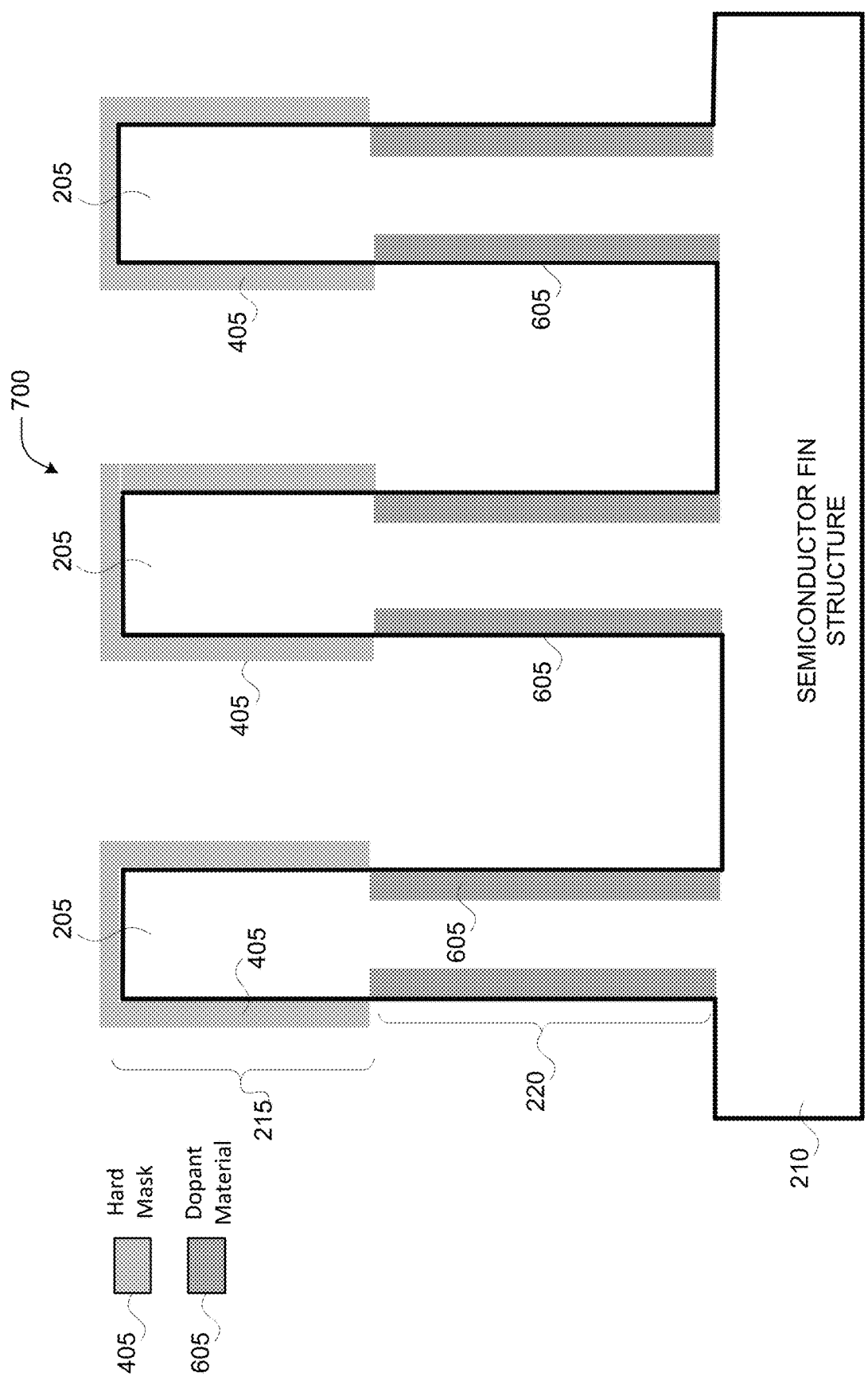

Referring to FIGS. 1 and 7, process 100 may proceed to operation 700, to perform an annealing process such that the dopant material 605 permeates a surface of the sub-fin region 220. The annealing process may be performed so that dopant atoms can diffuse into the surface of the sub-fin region 220, which may result in changes in the electrical properties of the sub-fin region 220 and/or the semiconductor fin structure. As shown by FIG. 7, the dopant material 605 has permeated the surface (e.g., side surfaces) of the sub-fin region 220, wherein the side surfaces of the sub-fin region 220 are represented by the relatively thick black lines in FIG. 7. In some embodiments, the concentration of dopant material 605 in the doped sub-fin region 220 may be greater proximate to each side surface of the doped sub-fin region 220 than in a middle portion of the doped sub-fin region 220. For example, the dopant material 605 may be at its highest concentration proximate to the surface(s) of the sub-fin region 220 and may be at its lowest concentration in the middle portion of the sub-fin region 220. The term "middle portion" may refer to a region or area of the fin 205 and/or the sub-fin region 220 that is between opposing side surfaces.

Additionally, as shown by FIG. 7, the hard mask 405 may reduce or prevent the dopant material 605 from permeating a surface of the top-fin region 215. Furthermore, the oxide material 305 (not shown) may reduce or prevent the dopant material 605 from permeating a surface of the substrate 210. Furthermore, although FIG. 7 shows that the dopant material 605 is infused into a portion of the sub-fin region 220, the example embodiments are not limited thereto. In some embodiments, the dopant material 605 may be infused into an entirety of the sub-fin region 220 such that the middle portion of the sub-fin region 220 includes at least some dopant material 605.

The annealing process may be any suitable annealing process, such as a spike annealing process, a drive-in annealing process, and the like. In various embodiments, the temperature of such an annealing process may be any suitable temperature such as a temperature in the range of 800° C. to 1100° C. In an example, an annealing condition of less than 1000° C. for less than 60 seconds may provide a diffusion length less than 20 nm for plasma immersion implanted/deposited Boron atoms. In various embodiments, the annealing process may include rapid thermal processing (RTP) where the semiconductor fin structure is subject to temperatures over 1000° C. for several seconds. An amount of penetration or a penetration depth of the dopant material 605 may be application specific and chosen according to one or more design choices. However, it should be noted that the amount of time of performing the annealing process may influence the penetration depth of the dopant material 605 into the sub-fin region 220. In various embodiments, the sub-fin region 220 may have a dopant concentration ranging from about 1e18 atoms per cubic centimeter (atoms/$cm^3$) to 5e18 atoms/$cm^3$ after the annealing process. In an example, to achieve a dopant concentration of 1e18 atom/$cm^3$ to 1e19 atom/$cm^3$, the implanted/deposited dopant material 605 dose may be in the range of about 1e13 atom/$cm^2$ to 1e14 atom/$cm^2$. In some embodiments, traces of nitrogen, ammonia, and/or other remnants from the conformal deposition process may also permeate the sub-fin region 220 during the annealing process. In various embodiments, once a desired amount of dopant material 605 permeates or penetrates the surface of the sub-fin region 220, any excess dopant material 605 remaining on the surface of the sub-fin region 220, on the hard mask 405, and/or the remaining oxide material 305 on the substrate 210 may be removed using a suitable etching process, such as wet chemical etching or a dry etching process (not shown). In some embodiments, such an etching process may also remove the remaining oxide material 305 from the substrate 210, as shown in FIG. 7.

Figure 8:
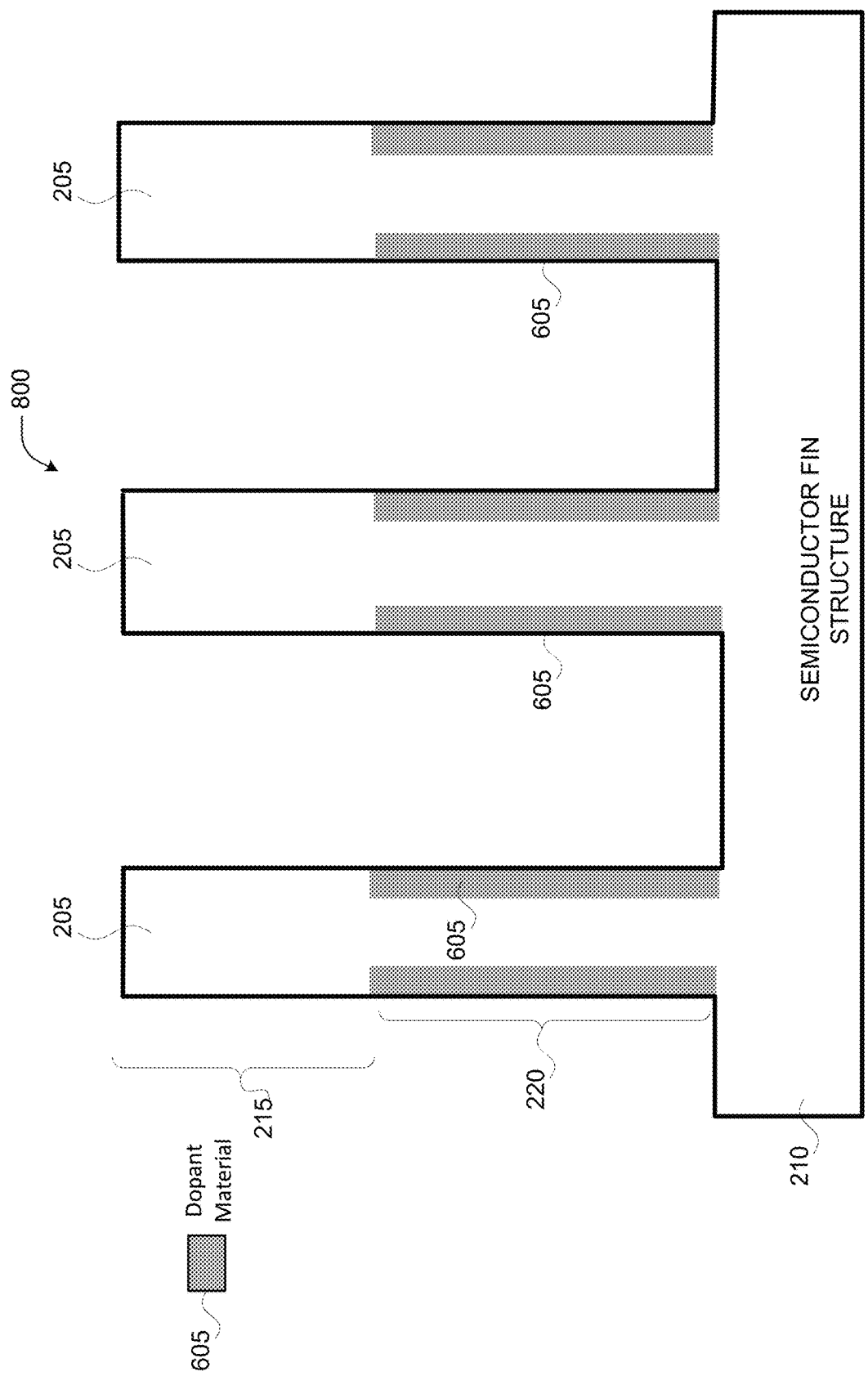

Referring to FIGS. 1 and 8, process 100 may proceed to operation 800, to remove the hard mask 405 from the top-fin region 215 to expose a surface of the top-fin region 215. Any suitable etching operation may be used to etch the hard mask 405 off the top-fin region 215. Such etching operations may include a wet chemical etching such as wet anisotropic etching using tetramethylammonium hydroxide (TMAH or $N(CH_3)_4^+OH^-$) and the like; or dry etching such as plasma etching, reactive ion etching, ion beam etching, and/or any other etching process described herein. In various embodiments, when the hard mask 405 is etched off, the surface of the top-fin region 215 may maintain a same or similar shape and/or structure (for example, as shown by the semiconductor fin structure of FIGS. 8-9). In various other embodiments, when the hard mask 405 is etched off, one or more layers of silicon of the top-fin region 215 may also be etched off, thereby exposing a top-fin region 215 (and a fin channel area) that is smaller in size than the sub-fin region 220 (for example, as shown by the semiconductor fin structure of FIG. 10). In some instances, the etching of the one or more layers of silicon of the top-fin region 215 may also result in an alteration of the shape of the top-fin region 215, such as producing a channel region having rounded side and/or top surfaces, and a sub-fin region 220 that has a width that is less than a width of a top-fin region 215 (for example, with a cross-sectional shape as shown by the semiconductor fin structure of FIG. 10). In some embodiments, the cross-sectional shape of the fin 205 may be referred to as "scallop shaped."

Figure 9:
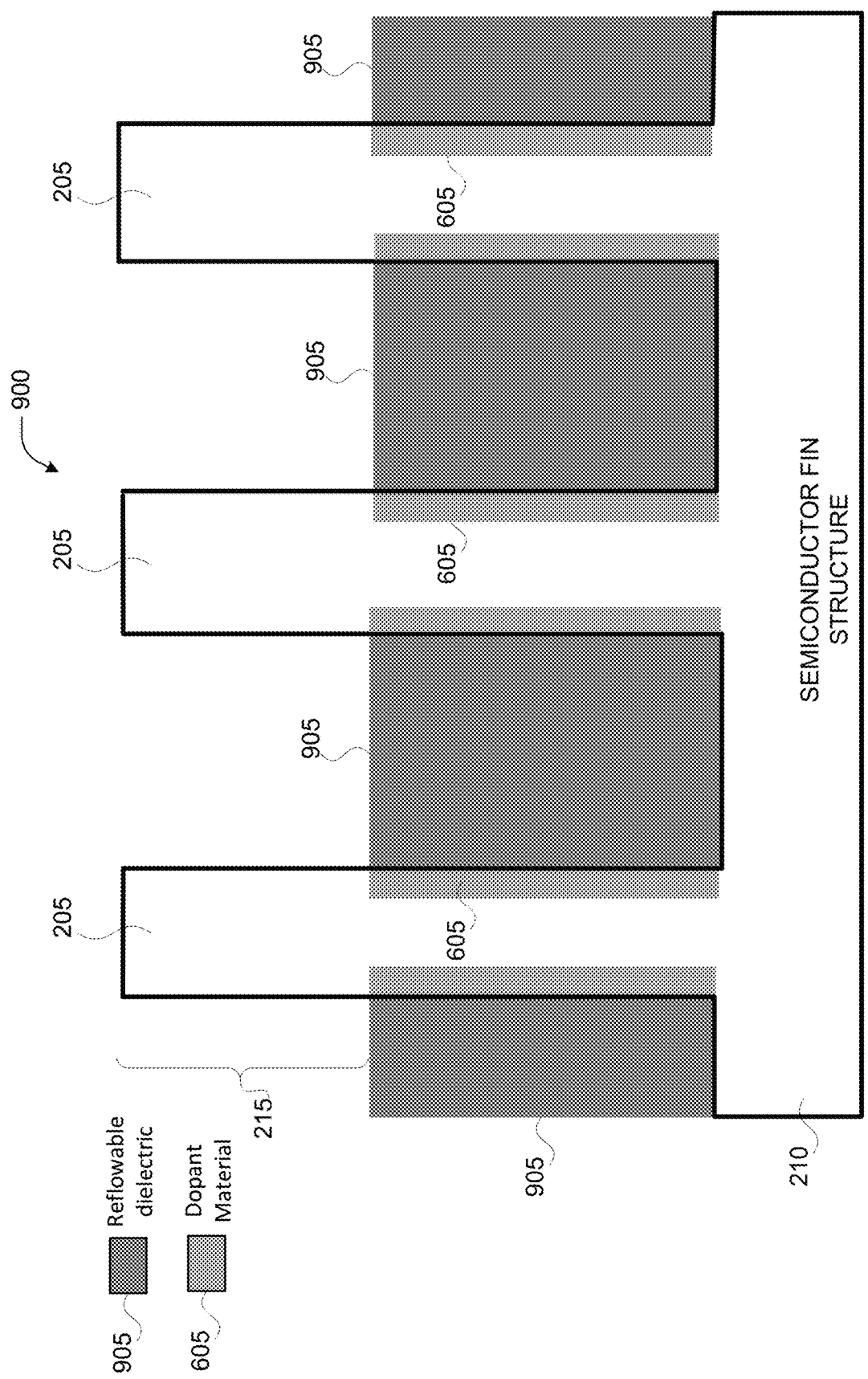

Referring to FIGS. 1 and 9, process 100 may proceed to operation 900, to deposit a reflowable dielectric material 905 on the sub-fin region 215 and/or substrate 210 (e.g., such that the sub-fin region 215 is covered by the reflowable dielectric material 905). The reflowable dielectric material 905 may be used to cover the substrate 210 and the sub-fin region 220 so only the undoped top-fin region 215 (or the channel region) is exposed for the construction and/or formation of further structures of a semiconductor device, such as tri-gate transistors, nanowires, and the like. The type of reflowable dielectric material 905 used may be application specific. In various embodiments, the reflowable dielectric material 905 may be a reflowable silicon oxide material and/or any other like reflowable film. In such embodiments, the reflowable dielectric material 905 may be applied by a spin-on operation that is the same or similar to the spin-on operation discussed previously. In such embodiments, the reflowable dielectric material 905 may be a SOG material. The SOG may be applied to the semiconductor fin structure at relatively low temperatures. The SOG may be made of any suitable SOG, such as an oxide SOG, an oxycarbide SOG, an oxycarbonitride SOG, a silicate SOG or an organosilicate SOG, and the like. Embodiments utilizing a SOG may be used for the construction and/or formation of high aspect ratio semiconductor devices, such as silicon nanowires and the like.

Figure 10:
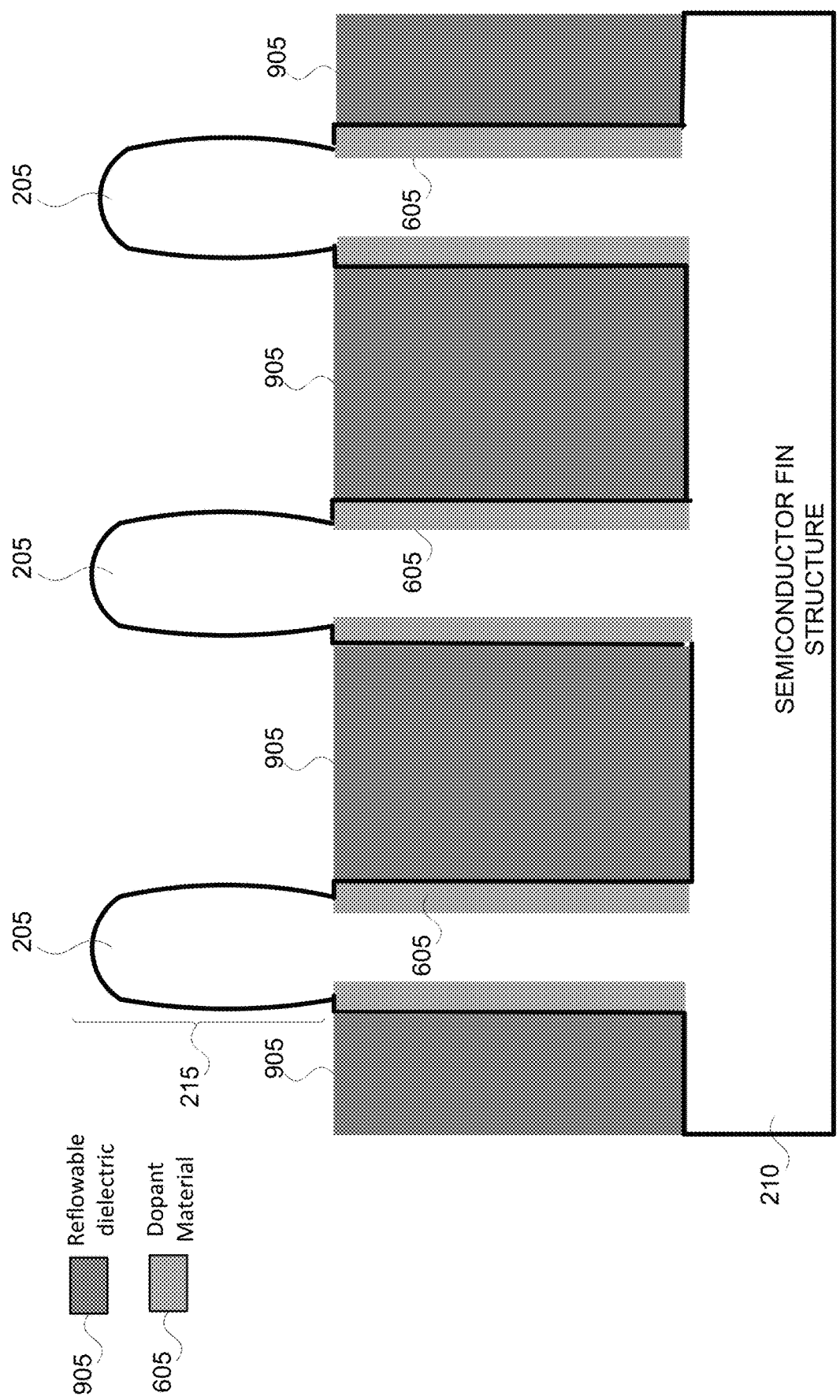
FIG. 10 illustrates a cross-sectional view of an example semiconductor fin structure having scalloped shaped fins, in accordance with various example embodiments.

FIG. 10 illustrates a cross-sectional view of an example semiconductor fin structure having scallop shaped fins 205, in accordance with various example embodiments. As noted previously, in various embodiments, when the hard mask 405 is etched off at operation 800, one or more layers of silicon of the top-fin region 215 may also be etched off, thereby exposing a top-fin region 215 (and a fin channel area) that is smaller in size than the sub-fin region 220. The etching of the one or more layers of the top-fin region 215 may result in an alteration of the shape and/or size of the top-fin region 215, which may produce a top-fin region 215 with rounded surfaces/edges and/or scallop shaped fins 205 as shown by FIG. 10. In other embodiments, the etching of the one or more layers of silicon of the top-fin region 215 may result in a semiconductor fin structure having one or more tapered fins 205. It should also be noted that in some embodiments, different fins 205 and/or top-fin regions 215 may have different sizes and/or shapes. The semiconductor fin structure shown by FIG. 10 also includes the reflowable dielectric material 905 as discussed previously with regard to FIG. 9.

As discussed, process 100 may be implemented to fabricate a semiconductor fin structure that may be used to fabricate one or more transistor structures. Any one or more of the operations of process 100 (or the operations discussed herein with respect to FIGS. 1-10) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Furthermore, any one or more of the operations of process 100 (or the operations discussed herein with respect to FIGS. 1-10) may be undertaken to form various semiconductor devices, such as transistor devices, memory devices, and/or the like. Such semiconductor devices may have at least one semiconductor structure comprising a plurality of fins disposed on a substrate wherein individual fins of the plurality of fins are laterally separated from other fins of the plurality of fins, individual fins of the plurality of fins extend away from the substrate, and individual fins of the plurality of fins comprise a doped sub-fin region that is disposed on the substrate and an undoped top-fin region disposed on the sub-fin region. Additionally, systems, apparatuses or devices may be formed that include a semiconductor substrate and one or more integrated circuit structures coupled to (for example, on and/or within the semiconductor substrate) the semiconductor substrate such that the one or more integrated circuit structures are fabricated using techniques discussed herein.

For example, apparatuses or devices may be formed that include a device layer such as a semiconductor substrate and one or more integrated circuit structures coupled to the semiconductor substrate such that the one or more integrated circuit structures are fabricated by forming a fin on a substrate such that the fin extends away from the substrate; covering the substrate and a portion of the fin with an oxide material such that a sub-fin region of the fin is covered by the oxide material and a top-fin region of the fin is not covered by the oxide material; forming a hard mask on the top-fin region; exposing a surface of the sub-fin region by removing the oxide material from the sub-fin region without removing the oxide material from the substrate; depositing a dopant material on the hard mask, the surface of the sub-fin region, and the oxide material on the substrate; removing the hard mask from the top-fin region to expose a surface of the top-fin region; and depositing, after removing the hard mask, a reflowable dielectric material such that the sub-fin region is covered by the reflowable dielectric material. Such integrated circuit structures may be further fabricated and/or otherwise integrated into platforms and/or computing devices as discussed herein with respect to FIGS. 11-14.

Figure 11:
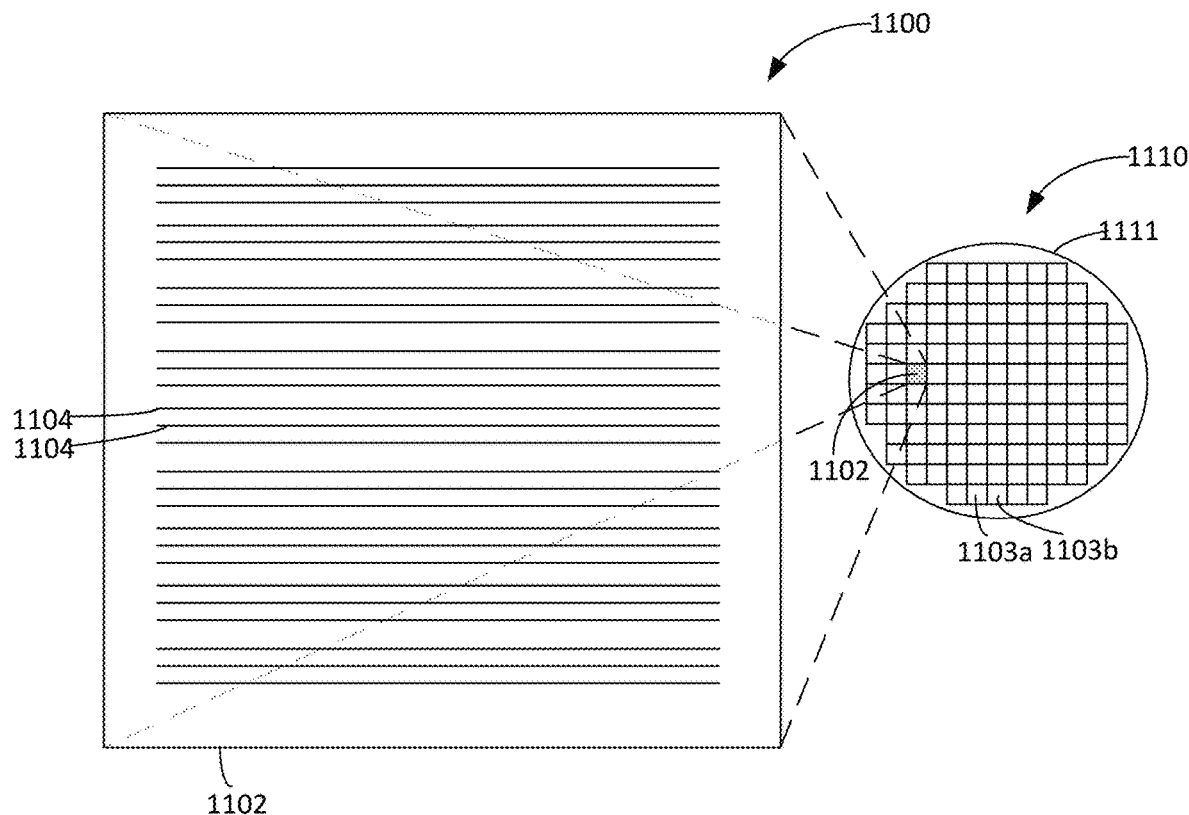
FIG. 11 schematically illustrates a top view of an example die in wafer form and in singulated form, in accordance with some embodiments.

FIG. 11 schematically illustrates a top view of an example die 1102 in wafer form 1110 and in singulated form 1100, in accordance with some embodiments. In some embodiments, the die 1102 may be one of a plurality of dies (e.g., dies 1102, 1103a, 1103b) of a wafer 1111 composed of semiconductor material such as, for example, silicon or other suitable material. The plurality of dies may be formed on a surface of the wafer 1111. Each of the dies may be a repeating unit of a semiconductor product that includes one or more transistor electrode assemblies (e.g., transistor electrode assemblies including semiconductor fin structures formed according to the example embodiments) as described herein. For example, the die 1102 may include circuitry having transistor structures 1104 such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 1104 to route electrical energy to or from the transistor structures 1104. For example, terminal contacts may be electrically coupled with a channel body to provide a gate electrode for delivery of a threshold voltage and/or a source/drain current to provide mobile charge carriers for operation of a transistor device. Although the transistor structures 1104 are depicted in rows that traverse a substantial portion of the die 1102 in FIG. 11 for the sake of simplicity, it is to be understood that the transistor structures 1104 may be configured in any of a wide variety of other suitable arrangements on the die 1102 in other embodiments, including, for example, vertical and horizontal features having much smaller dimensions than depicted.

After a fabrication process of the semiconductor product embodied in the dies is complete, the wafer 1111 may undergo a singulation process in which each of the dies (e.g., die 1102) is separated from one another to provide discrete "chips" of the semiconductor product. The wafer 1111 may be any of a variety of sizes. In some embodiments, the wafer 1111 has a diameter ranging from about 25.4 mm to about 450 mm. The wafer 1111 may include other sizes and/or other shapes in other embodiments. According to various embodiments, the transistor structures 1104 may be disposed on a semiconductor substrate in wafer form 1110 or singulated form 1100. The transistor structures 1104 described herein may be incorporated in a die 1102 for logic or memory, or combinations thereof. In some embodiments, the transistor structures 1104 may be part of a system-on-chip (SoC) assembly.

Figure 12:
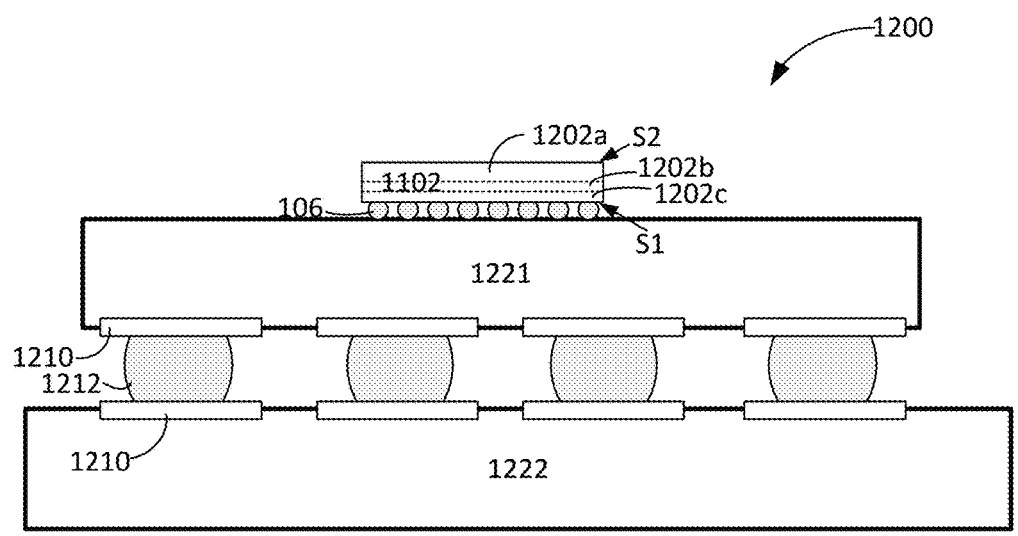
FIG. 12 schematically illustrates a cross-section side view of an integrated circuit (IC) assembly, in accordance with some embodiments.

FIG. 12 schematically illustrates a cross-section side view of an integrated circuit (IC) assembly 1200, in accordance with some embodiments. In some embodiments, the IC assembly 1200 may include one or more dies (hereinafter "die 1102") electrically and/or physically coupled with a package substrate 1221. In some embodiments, the package substrate 1221 may be electrically coupled with a circuit board 1222, as can be seen. In some embodiments, an integrated circuit (IC) assembly 1200 may include one or more of the die 1102, package substrate 1221 and/or circuit board 1222, according to various embodiments. Embodiments described herein for a transistor electrode assembly may be implemented in any suitable IC device according to various embodiments.

The die 1102 may represent a discrete product made from a semiconductor material (e.g., silicon) using semiconductor fabrication techniques such as thin film deposition, lithography, etching and the like used in connection with forming CMOS devices. In some embodiments, the die 1102 may be, include, or be a part of a processor, memory, SoC or ASIC. In some embodiments, an electrically insulative material such as, for example, molding compound or underfill material (not shown) may encapsulate at least a portion of the die 1102 and/or die-level interconnect structures 106.

The die 1102 can be attached to the package substrate 1221 according to a wide variety of suitable configurations including, for example, being directly coupled with the package substrate 1221 in a flip-chip configuration, as depicted. In the flip-chip configuration, an active side, S1, of the die 1102 including circuitry is attached to a surface of the package substrate 1221 using die-level interconnect structures 106 such as bumps, pillars, or other suitable structures that may also electrically couple the die 1102 with the package substrate 1221. The active side S1 of the die 1102 may include active devices such as, for example, transistor devices. An inactive side, S2, may be disposed opposite to the active side S1, as can be seen.

The die 1102 may generally include a semiconductor substrate 1202a, one or more device layers (hereinafter "device layer 1202b") and one or more interconnect layers (hereinafter "interconnect layer 1202c"). The semiconductor substrate 1202a may be substantially composed of a bulk semiconductor material such as, for example silicon, in some embodiments. The device layer 1202b may represent a region where active devices such as transistor devices are formed on the semiconductor substrate. The device layer 1202b may include, for example, transistor structures such as channel bodies and/or source/drain regions of transistor devices. The interconnect layer 1202c may include interconnect structures (e.g., electrode terminals) that are configured to route electrical signals to or from the active devices in the device layer 1202b. For example, the interconnect layer 1202c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 1202c and configured to route electrical signals between the die 1102 and other electrical devices. The electrical signals may include, for example, input/output (I/O) signals and/or power/ground signals that are used in connection with operation of the die 1102.

In some embodiments, the package substrate 1221 is an epoxy-based laminate substrate having a core and/or build-up layers such as, for example, an Ajinomoto Build-up Film (ABF) substrate. The package substrate 1221 may include other suitable types of substrates in other embodiments including, for example, substrates formed from glass, ceramic, or semiconductor materials.

The package substrate 1221 may include electrical routing features configured to route electrical signals to or from the die 1102. The electrical routing features may include, for example, pads or traces (not shown) disposed on one or more surfaces of the package substrate 1221 and/or internal routing features (not shown) such as, for example, trenches, vias or other interconnect structures to route electrical signals through the package substrate 1221. For example, in some embodiments, the package substrate 1221 may include electrical routing features such as pads (not shown) configured to receive the respective die-level interconnect structures 106 of the die 1102.

The circuit board 1222 may be a printed circuit board (PCB) composed of an electrically insulative material such as an epoxy laminate. For example, the circuit board 1222 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 1102 through the circuit board 1222. The circuit board 1222 may be composed of other suitable materials in other embodiments. In some embodiments, the circuit board 1222 is a motherboard (e.g., motherboard 1402 of FIG. 14).

Package-level interconnects such as, for example, solder balls 1212 may be coupled to one or more pads (hereinafter "pads 1210") on the package substrate 1221 and/or on the circuit board 1222 to form corresponding solder joints that are configured to further route the electrical signals between the package substrate 1221 and the circuit board 1222. The pads 1210 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 1221 with the circuit board 1222 may be used in other embodiments.

The IC assembly 1200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 1102 and other components of the IC assembly 1200 may be used in some embodiments.

Figure 13:
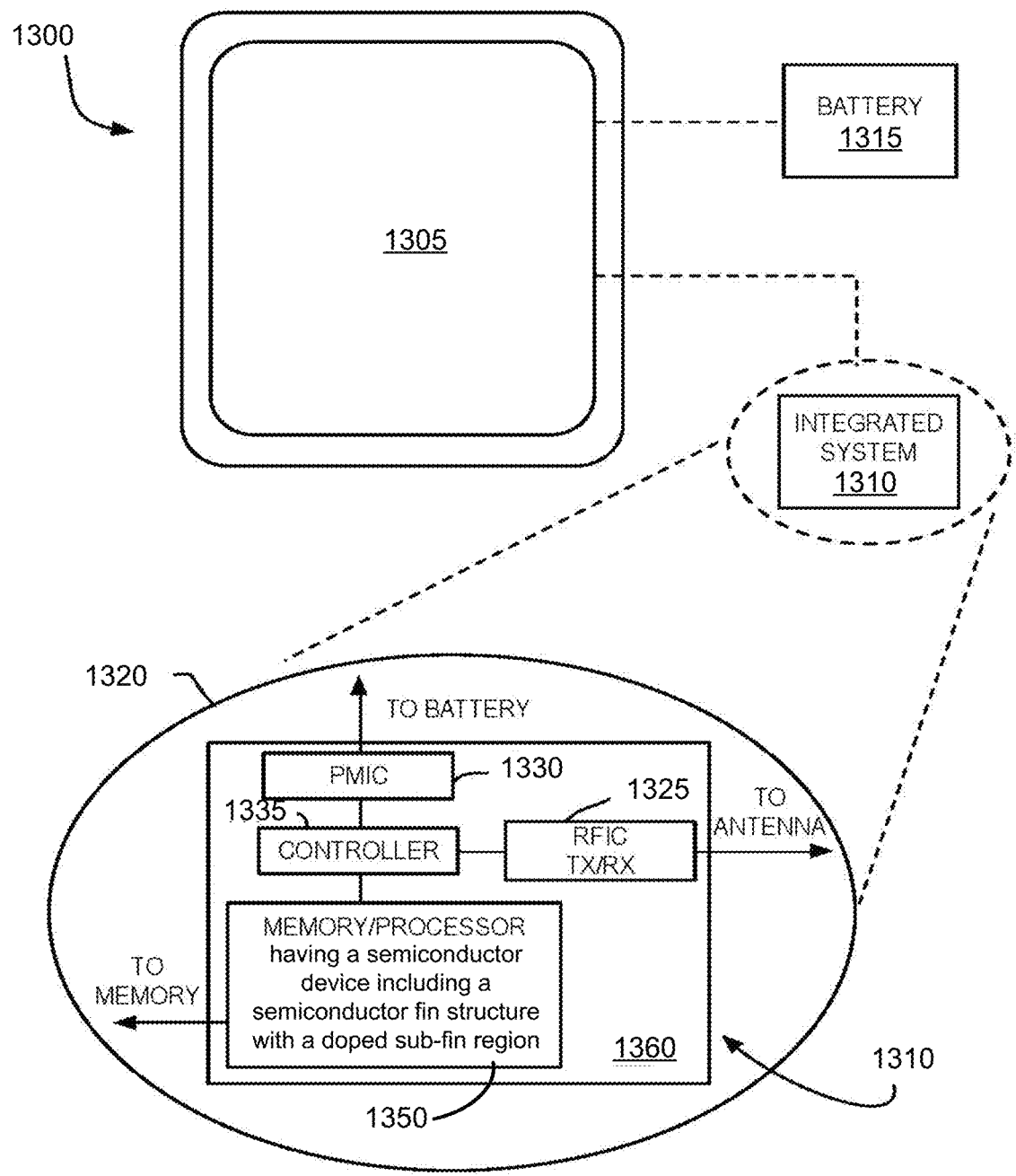
FIG. 13 is an illustrative diagram of a mobile computing platform employing an IC with transistor(s) fabricated according to the various example embodiments disclosed here.

FIG. 13 is an illustrative diagram of a mobile computing platform 1300 employing one or more integrated circuits (ICs) with a semiconductor device including at least one semiconductor fin structure fabricated via the selective sub-fin doping techniques disclosed herein. For example, a transistor fabricated or formed via the sub-fin doping techniques discussed herein may be included in one or more ICs implemented by the mobile computing platform 1300. Mobile computing platform 1300 may be any portable device configured for one or more of electronic data display, electronic data processing, wireless electronic data transmission, or the like. For example, mobile computing platform 1300 may be any of a tablet, a smart phone, a netbook, a laptop computer, etc. and may include a display screen 1305, which in the exemplary embodiment is a touchscreen (e.g., capacitive, inductive, resistive, etc. touchscreen), a chip-level (SoC) or package-level integrated system 1310, and a battery 1315.

Integrated system 1310 is further illustrated in the expanded view 1120. In the exemplary embodiment, packaged device 1350 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the package device 1350 is a microprocessor coupled to an SRAM cache memory. In some examples, one or both of the at least one memory and the at least one processor chip includes transistor(s) fabricated via the selective sub-fin doping techniques discussed herein. For example, a transistor of one or both of the processor or memory may include a semiconductor fin structure with a doped sub-fin region and/or other features as discussed herein. Packaged device 1350 may be further coupled to (e.g., communicatively coupled to) a board, a substrate, or an interposer 1360 along with, one or more of a power management integrated circuit (PMIC) 1330, radio frequency (RF) (wireless) integrated circuit (RFIC) 1325 including a wideband RF (wireless) transmitter and/or receiver (TX/RX) (for example, including a digital baseband and an analog front end module further comprises a power amplifier on a transmit path and a low noise amplifier on a receive path), and a controller thereof 1335. In general, packaged device 1350 may be also be coupled to (for example, communicatively coupled to) display screen 1305.

Functionally, PMIC 1330 may perform battery power regulation, direct current (DC)-to-DC conversion, etc., and so has an input coupled to battery 1315 and with an output providing a current supply to other functional modules. In an embodiment, PMIC 1330 may perform high voltage operations. As further illustrated, in the exemplary embodiment, RFIC 1325 has an output coupled to an antenna (not shown by FIG. 13) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1350 or within a single IC (e.g., System-on-Chip (SoC)) coupled to the package substrate of the packaged device 1350.

Figure 14:
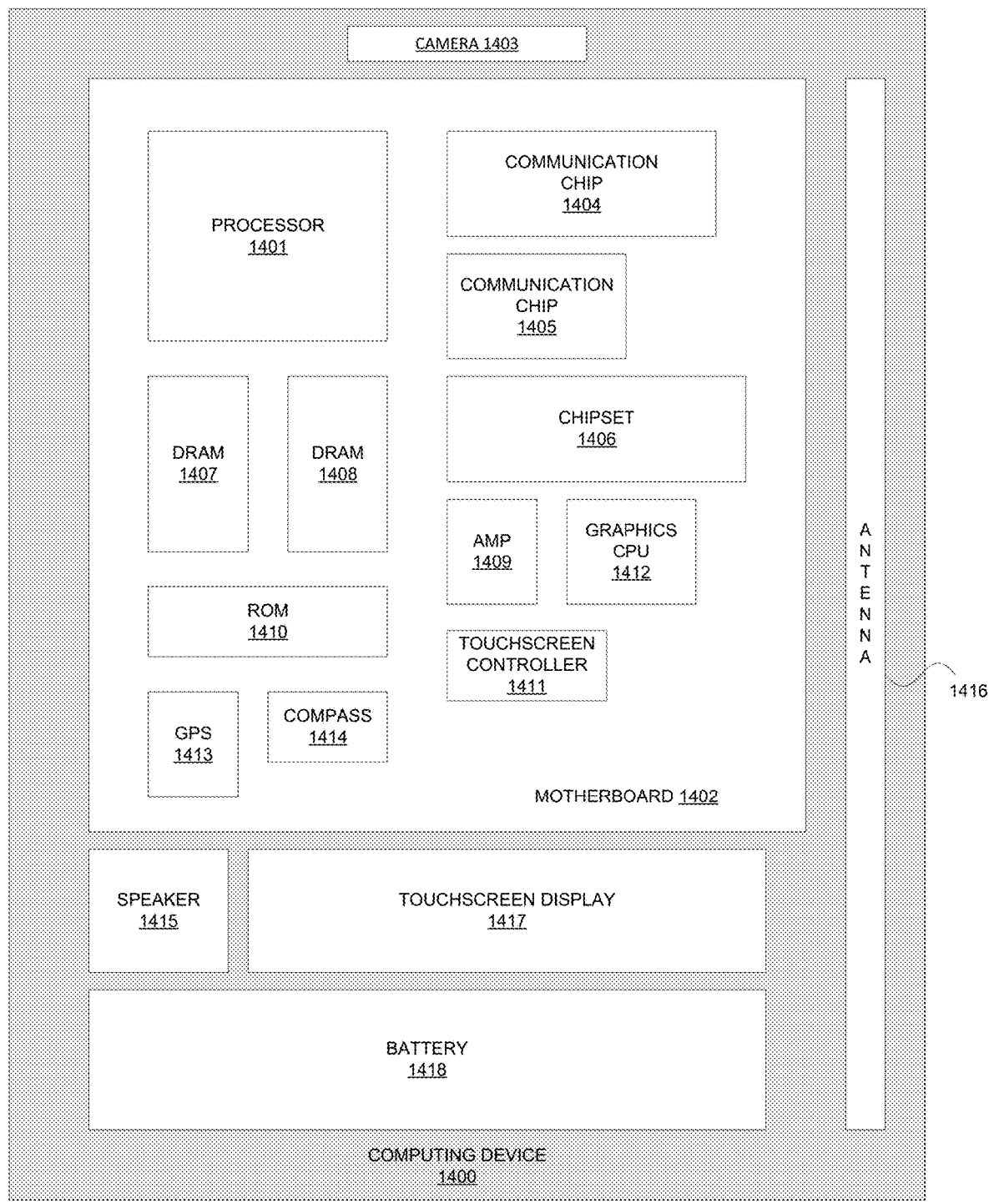
FIG. 14 is a functional block diagram of a computing device, arranged in accordance with at least some implementations of the present disclosure.

FIG. 14 is a functional block diagram of a computing device 1400, arranged in accordance with at least some implementations of the present disclosure. Computing device 1400 may be found inside platform 1300, for example, and further includes a motherboard 1402 hosting a number of components, such as but not limited to a processor 1401 (e.g., an applications processor) and one or more communications chips 1404, 1405. Processor 1401 may be physically and/or electrically coupled to motherboard 1402. In some examples, processor 1401 includes an integrated circuit die packaged within the processor 1401. In general, the term "processor" may refer to any device or portion of a device that processes electronic data from registers and/or memory to transform that electronic data into other electronic data that may be stored in registers and/or memory.

In various examples, one or more communication chips 1404, 1405 may also be physically and/or electrically coupled to the motherboard 1402. In further implementations, communication chips 1404 may be part of processor 1401. Depending on its applications, computing device 1400 may include other components that may or may not be physically and electrically coupled to motherboard 1402. These other components may include, but are not limited to, volatile memory (e.g., DRAM) 1407, 1408, non-volatile memory (e.g., ROM) 1410, a graphics processor 1412, flash memory, global positioning system (GPS) device 1413, compass 1414, a chipset 1406, an antenna 1416, a power amplifier 1409, a touchscreen controller 1411, a touchscreen display 1417, a speaker 1415, a camera 1403, and a battery 1418, as illustrated, and other components such as a digital signal processor, a crypto processor, an audio codec, a video codec, an accelerometer, a gyroscope, a mass storage device (such as hard disk drive, solid state drive (SSD), compact disk (CD), digital versatile disk (DVD), and so forth), a Geiger counter, a gravimeter, a pressure sensor, a humidity sensor, a proximity sensor, and/or the like.

Communication chips 1404, 1405 may enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1404, 1405 may implement any of a number of wireless standards or protocols, including but not limited to those described elsewhere herein. As discussed, computing device 1400 may include a plurality of communication chips 1404, 1405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

Example 1 may include a method for fabricating a semiconductor fin structure to be used in a semiconductor device. The method may comprise forming a fin on a substrate such that the fin extends away from the substrate; forming an oxide material on the substrate and a portion of the fin that corresponds to a sub-fin region of the fin; forming a hard mask on a top-fin region of the fin that is disposed above the sub-fin region; exposing a surface of the sub-fin region by removing the oxide material from a surface of the sub-fin region and leaving a layer of the oxide material on the substrate; depositing a dopant material on the hard mask, the surface of the sub-fin region, and the layer of the oxide material on the substrate; and removing the hard mask from the top-fin region to expose a surface of the top-fin region.

Example 2 may include the method of example 1 and/or any other one or more examples disclosed herein, wherein the substrate is formed of silicon, the forming the fin includes patterning the fin out of the silicon of the substrate, and the top-fin region corresponds to an active channel of a three-dimensional transistor or a tri-gate transistor.

Example 3 may include the method of example 2 and/or any other one or more examples disclosed herein, wherein the removing the hard mask from the top-fin region includes performing an etching operation such that a layer of the silicon is removed from the top-fin region, and the method may further comprise depositing, after removing the hard mask, a reflowable dielectric material on the sub-fin region.

Example 4 may include the method of any one of examples 1 to 3 and/or any other one or more examples disclosed herein, wherein the oxide material is silicon oxide or silicon dioxide, and the depositing oxide material on the substrate and the portion of the fin may comprise forming the oxide material on the substrate by performing an spin-on operation for a desired period of time.

Example 5 may include the method of any one of examples 1 to 3 and/or any other one or more examples disclosed herein, wherein the hard mask is a silicon nitride material, $Si_xN_y$, and the forming the hard mask includes depositing a $Si_xN_y$ layer on the top-fin region by performing a deposition operation comprising at least one of plasma exposure, atomic layer deposition, molecular layer deposition, or chemical vapor deposition.

Example 6 may include the method of example 5 and/or any other one or more examples disclosed herein, wherein the forming the hard mask further includes forming the $Si_xN_y$ layer to have a thickness of up to 5 nanometers; and performing the deposition operation with a temperature between room temperature and 1100 degrees Celsius.

Example 7 may include the method of example 6 and/or any other one or more examples disclosed herein, wherein the forming the $Si_xN_y$ layer includes exposing the top-fin region to a plasma at a temperature between 400 degrees Celsius and 1100 degrees Celsius for up to 600 seconds, wherein the plasma includes a remote Nitrogen ($N_2$) plasma, a remote Ammonia ($NH_3$) plasma, or an a hydrazine.

Example 8 may include the method of example 7 and/or any other one or more examples disclosed herein, wherein the forming the $Si_xN_y$ layer includes exposing the top-fin region to a reactive gas, a diluted inert gas, or a hydrazine, wherein the reactive gas is Hydrogen, and the diluted inert gas is Helium, Argon, or a combination of Helium and Argon.

Example 9 may include the method of example 1 and/or any other one or more examples disclosed herein, wherein the removing the oxide material from the surface of the sub-fin region includes performing an oxide recess operation such that the layer of the oxide material remains on the substrate after the oxide recess operation is performed, wherein the remaining oxide material is to protect the substrate during the depositing of the dopant material, and wherein the oxide recess operation comprises wet chemical etching or dry etching.

Example 10 may include the method of any one of examples 1 to 3 and/or any other one or more examples disclosed herein, further comprising:

performing, after depositing the dopant material, an annealing process such that the dopant material permeates a surface of the sub-fin region.

Example 11 may include the method of any one of examples 1 to 3 and/or any other one or more examples disclosed herein, wherein the dopant material includes boron, phosphorus, arsenic, antimony, indium, or a combination of two or more of boron, phosphorus, arsenic, antimony, and indium.

Example 12 may include the method of any one of claims 1 to 3 and/or any other one or more examples disclosed herein, wherein the depositing the dopant material includes performing a conformal deposition process including at least one of implant plasma dopant deposition, atomic layer deposition, molecular layer deposition, or chemical vapor deposition, wherein a thickness of a layer of the deposited dopant material is 0.1 nanometers to 5 nanometers.

Example 13 may include the method of example 12 and/or any other one or more examples disclosed herein, wherein the conformal deposition process by atomic layer deposition includes using a halide and a homoelement precursor, wherein the halide includes Fluorine, Chlorine, Bromine or Iodine, and wherein the homoelement precursor includes a homoleptic silyl or a homoleptic germyl compound.

Example 14 may include the method of example 12 and/or any other one or more examples disclosed herein, wherein the conformal deposition process is performed by atomic layer deposition and includes atomic layer deposition of boron, phosphorous, arsenic, or antimony and deposition of at least one halide as a precursor and 1,4-dihydro-1,4-bis (trimethylsilyl) pyrazine as a reducing agent.

Example 15 may include the method of example 12 and/or any other one or more examples disclosed herein, wherein the conformal deposition process is performed by atomic layer deposition and includes depositing at least one of Boron trichloride ($BCl_3$) or tris(trimethylsilyl)boron ($B(SiMe_3)_3$); depositing at least one of Phosphorus trichloride ($PCl_3$) or tris(trimethylsilyl)phosphine ($P(SiMe_3)_3$); depositing at least one of Arsenic trichloride ($AsCl_3$) or tris(trimethylsilyl)arsine ($As(SiMe_3)_3$); or depositing at least one of Antimony trichloride ($SbCl_3$) and tris(trimethylsilyl) antimony ($Sb(SiMe_3)_3$.

Example 16 may include the method of example 12 and/or any other one or more examples disclosed herein, wherein the conformal deposition process is performed by molecular layer deposition and includes exposing the semiconductor device to a precursor including allylboronic acid pinacol ester, triallylphosphine, or triallylarsine; depositing one or more dopant capping layers on to the sub-fin region; performing a drive-in annealing operation to diffuse the dopant material in to the sub-fin region; and removing the one or more dopant capping layers and at least one layer of the dopant material.

Example 17 may include a semiconductor fin structure to be used in a semiconductor device, comprising a plurality of fins disposed on a substrate wherein individual fins of the plurality of fins are laterally separated from other fins of the plurality of fins, and individual fins of the plurality of fins extend away from the substrate, wherein individual fins of the plurality of fins include a doped sub-fin region that is disposed on the substrate and an undoped top-fin region disposed on the sub-fin region, wherein a concentration of dopant material in the doped sub-fin region is greater proximate to a surface of the doped sub-fin region than in a middle portion of the doped sub-fin region.

Example 18 may include the semiconductor fin structure of example 17 and/or any other one or more examples disclosed herein, further comprising a spin-on glass (SOG) reflowable dielectric material that substantially covers the doped sub-fin region and the substrate.

Example 19 may include the semiconductor fin structure of example 17 and/or any other one or more examples disclosed herein, wherein, for individual fins of the plurality of fins, the doped sub-fin region has a greater width than a width of the undoped top-fin region.

Example 20 may include the semiconductor fin structure of example 17 and/or any other one or more examples disclosed herein, wherein a surface of at least a top-fin region of individual fins of the plurality of fins has rounded edges.

Example 21 may include the semiconductor fin structure of any one of examples 17-20 and/or any other one or more examples disclosed herein, wherein the sub-fin region includes: boron, phosphorus, arsenic, antimony, indium; or a combination of nitrogen or ammonia and two or more of boron, phosphorus, arsenic, antimony, and indium.

Example 22 may include a computing device comprising a memory device; and a processor coupled to the memory device, the processor including a semiconductor device comprising at least one semiconductor fin structure, the at least one semiconductor fin structure including a plurality of fins disposed on a substrate wherein individual fins of the plurality of fins are laterally separated from other fins of the plurality of fins, wherein individual fins of the plurality of fins extend away from the substrate, wherein individual fins of the plurality of fins include a doped sub-fin region that is disposed on the substrate and an undoped top-fin region that is disposed on the sub-fin region, and wherein the plurality of fins act as channel regions of one or more transistors; and a reflowable dielectric material that substantially covers the doped sub-fin region and the substrate.

Example 23 may include the computing device of example 22, wherein, for individual fins of the plurality of fins, the doped sub-fin region has a greater width than a width of the undoped top-fin region.

Example 24 may include the computing device of example 22 and/or any other one or more examples disclosed herein, wherein, for individual fins of the plurality of fins, at least a surface of the undoped top-fin region has rounded edges.

Example 25 may include the computing device of any one of examples 22-24 and/or any other one or more examples disclosed herein, wherein the doped sub-fin region includes: boron, phosphorus, arsenic, antimony, indium; or a combination of nitrogen or ammonia and two or more of boron, phosphorus, arsenic, antimony, and indium.

Example 26 may include the computing device of any one of claims 22-24 and/or any other one or more examples disclosed herein, wherein the computing device is includes one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, a digital signal processor, a crypto processor, an audio codec, a video codec, an accelerometer, a gyroscope, a mass storage device, a gravimeter, a pressure sensor, a humidity sensor, and a proximity sensor.

Example 27 may include a semiconductor fin structure formed according to the method of any of examples 1-16 and/or any other one or more examples disclosed herein, and/or any other one or more examples disclosed herein.

Example 28 may include the semiconductor fin structure of example 17 and/or any other one or more examples disclosed herein, wherein the semiconductor fin structure is formed by forming a fin on a substrate such that the fin extends away from the substrate; forming an oxide material on the substrate and a portion of the fin that corresponds to a sub-fin region of the fin; forming a hard mask on a top-fin region of the fin that is disposed above the sub-fin region; exposing a surface of the sub-fin region by removing the oxide material from a surface of the sub-fin region and leaving a layer of the oxide material on the substrate; depositing a dopant material on the hard mask, the surface of the sub-fin region, and the layer of the oxide material on the substrate; and removing the hard mask from the top-fin region to expose a surface of the top-fin region.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method for fabricating a semiconductor fin structure to be used in a semiconductor device comprising:
   forming a fin on a substrate such that the fin extends away from the substrate;

forming an oxide material on the substrate and a portion of the fin that corresponds to a sub-fin region of the fin;

forming a hard mask on a top-fin region of the fin that is disposed above the sub-fin region;

exposing a surface of the sub-fin region by removing the oxide material from a surface of the sub-fin region and leaving a layer of the oxide material on the substrate;

depositing a dopant material on the hard mask, the surface of the sub-fin region, and the layer of the oxide material on the substrate;

removing the hard mask from the top-fin region to expose a surface of the top-fin region; and removing the layer of the oxide material from the substrate.

2. The method of claim 1, wherein the substrate is formed of silicon, the forming the fin includes patterning the fin out of the silicon of the substrate, and the top-fin region corresponds to an active channel of a three-dimensional transistor or a tri-gate transistor.

3. The method of claim 2, wherein the removing the hard mask from the top-fin region includes performing an etching operation such that a layer of the silicon is removed from the top-fin region, and the method further comprises:

depositing, after removing the hard mask and the layer of the oxide material from the substrate, a reflowable dielectric material on the sub-fin region.

4. The method claim 1, wherein the oxide material is silicon oxide or silicon dioxide, and the depositing oxide material on the substrate and the portion of the fin comprises:

forming the oxide material on the substrate by performing a spin-on operation for a desired period of time.

5. The method of claim 1, wherein the hard mask is a silicon nitride material, $Si_xN_y$, and the forming the hard mask includes depositing a $Si_xN_y$ layer on the top-fin region by performing a deposition operation comprising at least one of plasma exposure, atomic layer deposition, molecular layer deposition, or chemical vapor deposition.

6. The method of claim 5, wherein the forming the hard mask further includes:

forming the $Si_xN_y$ layer to have a thickness of up to 5 nanometers; and performing the deposition operation with a temperature between room temperature and 1100 degrees Celsius.

7. The method of claim 6, wherein the forming the $Si_xN_y$ layer includes:

exposing the top-fin region to a plasma at a temperature between 400 degrees Celsius and 1100 degrees Celsius for up to 600 seconds, wherein the plasma includes a remote Nitrogen ($N_2$) plasma, a remote Ammonia ($NH_3$) plasma, or an a hydrazine.

8. The method of claim 7, wherein the forming the $Si_xN_y$ layer includes exposing the top-fin region to a reactive gas, a diluted inert gas, or a hydrazine, wherein the reactive gas is Hydrogen, and the diluted inert gas is Helium, Argon, or a combination of Helium and Argon.

9. The method of claim 1, wherein the removing the oxide material from the surface of the sub-fin region includes:

performing an oxide recess operation such that the layer of the oxide material remains on the substrate after the oxide recess operation is performed, wherein the remaining oxide material is to protect the substrate during the depositing of the dopant material, and wherein the oxide recess operation comprises wet chemical etching or dry etching.

10. The method of claim 1, further comprising:

performing, after depositing the dopant material, an annealing process such that the dopant material permeates a surface of the sub-fin region.

11. The method of claim 1, wherein the dopant material includes boron, phosphorus, arsenic, antimony, indium, or a combination of two or more of boron, phosphorus, arsenic, antimony, and indium.

12. The method of claim 1, wherein the depositing the dopant material includes:

performing a conformal deposition process including at least one of implant plasma dopant deposition, atomic layer deposition, molecular layer deposition, or chemical vapor deposition, wherein a thickness of a layer of the deposited dopant material is 0.1 nanometers to 5 nanometers.

13. The method of claim 12, wherein the conformal deposition process by atomic layer deposition includes using a halide and a homoelement precursor, wherein the halide includes Fluorine, Chlorine, Bromine or Iodine, and wherein the homoelement precursor includes a homoleptic silyl or a homoleptic germyl compound.

14. The method of claim 12, wherein the conformal deposition process is performed by atomic layer deposition and includes atomic layer deposition of boron, phosphorous, arsenic, or antimony and deposition of at least one halide as a precursor and 1,4-dihydro-1,4-bis(trimethylsilyl) pyrazine as a reducing agent.

15. The method of claim 12, wherein the conformal deposition process is performed by atomic layer deposition and includes depositing at least one of Boron trichloride ($BCl_3$) or tris(trimethylsilyl)boron ($B(SiMe_3)_3$); depositing at least one of Phosphorus trichloride ($PCl_3$) or tris(trimethylsilyl)phosphine ($P(SiMe_3)_3$); depositing at least one of Arsenic trichloride ($AsCl_3$) or tris(trimethylsilyl)arsine ($As(SiMe_3)_3$); or depositing at least one of Antimony trichloride ($SbCl_3$) and tris(trimethylsilyl)antimony ($Sb(SiMe_3)_3$).

16. The method of claim 12, wherein the conformal deposition process is performed by molecular layer deposition and includes:

exposing the semiconductor device to a precursor including allylboronic acid pinacol ester, triallylphosphine, or triallylarsine;

depositing one or more dopant capping layers on to the sub-fin region;

performing a drive-in annealing operation to diffuse the dopant material in to the sub-fin region; and removing the one or more dopant capping layers and at least one layer of the dopant material.

17. A semiconductor fin structure to be used in a semiconductor device, comprising:

a plurality of fins disposed on a substrate wherein individual fins of the plurality of fins are laterally separated from other fins of the plurality of fins, and individual fins of the plurality of fins extend away from the substrate, wherein individual fins of the plurality of fins include a doped sub-fin region that is disposed on the substrate and an undoped top-fin region disposed on the sub-fin region, wherein a concentration of dopant material in the doped sub-fin region is greater proximate to a surface of the doped sub-fin region than in a middle portion of the doped sub-fin region, and the semiconductor fin structure having been formed by:

forming a fin on a substrate such that the fin extends away from the substrate;

forming an oxide material on the substrate and a portion of the fin that corresponds to a sub-fin region of the fin;

forming a hard mask on a top-fin region of the fin that is disposed above the sub-fin region;

exposing a surface of the sub-fin region by removing the oxide material from a surface of the sub-fin region and leaving a layer of the oxide material on the substrate;

depositing a dopant material on the hard mask, the surface of the sub-fin region, and the layer of the oxide material on the substrate;

removing the hard mask from the top-fin region to expose a surface of the top-fin region; and removing the layer of the oxide material from the substrate.

18. The semiconductor fin structure of claim 17, further comprising:

a spin-on glass (SOG) reflowable dielectric material that substantially covers the doped sub-fin region and the substrate.

19. The semiconductor fin structure of claim 17, wherein, for individual fins of the plurality of fins, the doped sub-fin region has a greater width than a width of the undoped top-fin region.

20. The semiconductor fin structure of claim 17, wherein a surface of at least a top-fin region of individual fins of the plurality of fins has rounded edges.

21. The semiconductor fin structure of claim 17, wherein the sub-fin region includes: boron, phosphorus, arsenic, antimony, indium; or a combination of nitrogen or ammonia and two or more of boron, phosphorus, arsenic, antimony, and indium.

22. A computing device comprising:

a memory device; and a processor coupled to the memory device, the processor including a semiconductor device comprising at least one semiconductor fin structure, the at least one semiconductor fin structure including:

a plurality of fins disposed on a substrate wherein individual fins of the plurality of fins are laterally separated from other fins of the plurality of fins, wherein individual fins of the plurality of fins extend away from the substrate, wherein individual fins of the plurality of fins include a doped sub-fin region that is disposed on the substrate and an undoped top-fin region that is disposed on the sub-fin region, and wherein the plurality of fins act as channel regions of one or more transistors; and a reflowable dielectric material that substantially covers the doped sub-fin region and the substrate, and the at least one semiconductor fin structure having been formed by:

forming a fin on a substrate such that the fin extends away from the substrate;

forming an oxide material on the substrate and a portion of the fin that corresponds to a sub-fin region of the fin;

forming a hard mask on a top-fin region of the fin that is disposed above the sub-fin region;

exposing a surface of the sub-fin region by removing the oxide material from a surface of the sub-fin region and leaving a layer of the oxide material on the substrate;

depositing a dopant material on the hard mask, the surface of the sub-fin region, and the layer of the oxide material on the substrate;

removing the hard mask from the top-fin region to expose a surface of the top-fin region; and removing the layer of the oxide material from the substrate.

23. The computing device of claim 22, wherein, for individual fins of the plurality of fins, the doped sub-fin region has a greater width than a width of the undoped top-fin region.

24. The computing device of claim 22, wherein, for individual fins of the plurality of fins, at least a surface of the undoped top-fin region has rounded edges.

25. The computing device of claim 22, wherein the doped sub-fin region includes: boron, phosphorus, arsenic, antimony, indium; or a combination of nitrogen or ammonia and two or more of boron, phosphorus, arsenic, antimony, and indium.

* * * * *